United States Patent
Lin et al.

(10) Patent No.: US 8,172,632 B2
(45) Date of Patent: May 8, 2012

(54) METHOD OF MAKING WHITE LED PACKAGE STRUCTURE HAVING A SILICON SUBSTRATE

(75) Inventors: Hung-Yi Lin, Tao-Yuan Hsien (TW); Hong-Da Chang, Tai-Chung Hsien (TW)

(73) Assignee: Touch Micro-System Technology Corp., Yang-Mei (TW)

( * ) Notice: Subject to any disclaimer, the term of this patent is extended or adjusted under 35 U.S.C. 154(b) by 33 days.

(21) Appl. No.: 12/613,508

(22) Filed: Nov. 5, 2009

(65) Prior Publication Data

US 2010/0047942 A1 Feb. 25, 2010

Related U.S. Application Data

(62) Division of application No. 11/736,595, filed on Apr. 18, 2007, now Pat. No. 7,741,772.

(30) Foreign Application Priority Data

Feb. 8, 2007 (TW) .............................. 96104580 A

(51) Int. Cl.
*H01J 9/26* (2006.01)
(52) U.S. Cl. .......................................... 445/25; 313/502
(58) Field of Classification Search ............... 445/23–25; 313/498
See application file for complete search history.

(56) References Cited

U.S. PATENT DOCUMENTS

| 6,531,328 | B1 | 3/2003 | Chen | |
|---|---|---|---|---|
| 6,756,731 | B1 | 6/2004 | Sano | |
| 7,071,493 | B2 | 7/2006 | Owen | |
| 2002/0134749 | A1* | 9/2002 | Cho | .............. 216/24 |
| 2004/0104391 | A1 | 6/2004 | Maeda | |
| 2004/0239243 | A1 | 12/2004 | Roberts | |
| 2006/0076571 | A1 | 4/2006 | Hsieh | |
| 2006/0180828 | A1 | 8/2006 | Kim | |
| 2006/0191351 | A1* | 8/2006 | Meehan et al. | ............. 73/780 |
| 2006/0198137 | A1 | 9/2006 | Lee | |
| 2007/0090510 | A1 | 4/2007 | Tseng | |

FOREIGN PATENT DOCUMENTS

TW 200644270 12/2006
* cited by examiner

*Primary Examiner* — Toan Ton
*Assistant Examiner* — Andrew Coughlin
(74) *Attorney, Agent, or Firm* — Chen Yoshimura LLP

(57) ABSTRACT

A method of making a white LED package structure having a silicon substrate comprises providing a silicon substrate and performing an etching process to form a plurality of cup-structures on a top surface of the silicon substrate. Next, a reflective layer on the top surface of the silicon substrate is formed, and a transparent insulating layer on the reflective layer is formed. Subsequently, a plurality of blue LEDs are respectively bonded in each cup-structure, wherein the blue LEDs have various wavelengths. Last, a plurality of kinds of phosphor powders corresponding to the wavelengths of the blue LEDs are mixed with each other and added to a sealing material, and a sealing process is performed to form a phosphor structure on the cup-structures.

28 Claims, 16 Drawing Sheets

METHOD OF MAKING WHITE LED PACKAGE STRUCTURE HAVING A SILICON SUBSTRATE

CROSS REFERENCE TO RELATED APPLICATIONS

This application is a division of application Ser. No. 11/736,595 filed on Apr. 18, 2007.

BACKGROUND OF THE INVENTION

1. Field of the Invention

The present invention relates to a method of making a white LED package structure having a silicon substrate, and more particularly, to a method of making a white LED package structure having a silicon substrate with good thermal conductivity and good light condensation to raise the color rendering and the colorfulness of tone.

2. Description of the Prior Art

In recent years, a white LED is a new product that is most expected and focused on worldwide. The white LED has advantages of small volume, no radiation, low power consumption, long lifetime, fast response rate and functions of environment protection etc., and also can solve many past problems that incandescent lamps could not overcome. Therefore, scientists in Europe and America have served the white LED as a light source in 21 century.

Please refer to FIG. 1. FIG. 1 is a cross-sectional schematic diagram of a white LED package structure according to the prior art. The white LED package structure 10 comprises a blue LED 11, a substrate 12, two electrodes 13, 14, a conductive layer 15 and a phosphor structure 16. The blue LED 11 is a main light-emitting element of the white LED package structure 10. The conductive layer 15 can be disposed on the substrate 12 by the process of metal deposition, exposure and lithography etc., and the blue LED 11 can be electrically connected to the electrodes 13, 14 through the conductive layer 15. The phosphor structure 16 is used for preventing the blue LED 11 from being directly exposed to the exterior, and the phosphor powders doped in the phosphor structure 16 including epoxy resin has a function of absorbing the blue light and converting blue light to yellow light. Therefore, a portion of blue light emitting from the blue LED 11 will be absorbed and converted to yellow light by the phosphor structure 16, and the yellow light will be mixed with the other portion of the blue light so that white light is produced.

The defect in current technology is that only one blue LED is disposed in the white LED package structure 10. If a brighter illumination or a larger size of light source is required, to combine several white LED package structures 10 is necessary. However, one white LED package structure 10 has a specific size, so the size of the light source is much larger. In addition, the full width at half maximum (FWHM) of the wavelength of one blue LED is about 25 nm. In manufacturing process, a great deal of the blue LEDs cannot be made to all have the same wavelength. Therefore, the produced blue LEDs currently can be divided into three specifications by the wavelengths of the blue LEDs, and the specifications are 450±5 μm, 460±5 μm and 470±5 μm. In accordance with the three specifications, the three corresponding phosphor powders are respectively created to produce the white LED. However, because the condition of manufacturing the blue LEDs is not easy to control, the wavelength of the blue LED will easily have a deviation effect. Even using the blue LED with the same specification, the produced white LEDs still will have various tones of the white light. The color rendering of the white LED is lower than that of fluorescent lamps and incandescent lamps, and the colorfulness of tone of the white LED is, too. Therefore, to produce a white LED having high color rendering and colorful tone to match the natural light is an object that needs the industry to improve.

SUMMARY OF THE INVENTION

It is therefore an object of the present invention to provide a method of making a white LED package structure that has better thermal conductivity and condensation of light and raises the color rendering and the colorfulness of tone.

According to an embodiment of the present invention, a method of making a white LED package structure having a silicon substrate is provided. The method comprises providing a silicon substrate and performing an etching process to form a plurality of cup-structures on a top surface of the silicon substrate. Next, a reflective layer on the top surface of the silicon substrate is formed, and a transparent insulating layer on the reflective layer is formed. Then, a plurality of metal bumps on the transparent insulating layer in each cup-structure is formed, and a plurality of electrodes on the transparent layer between the adjacent cup-structures is formed. Subsequently, a plurality of blue LEDs are respectively bonded on the metal bumps in each cup-structure, and electrically connected respectively to the electrodes, wherein the blue LEDs have various wavelengths. Last, a plurality of kinds of phosphor powders corresponding to the wavelengths of the blue LEDs are mixed with each other and added to a sealing material, and a sealing process is performed to form a phosphor structure on the cup-structures.

According to another embodiment of the present invention, a method of making a white LED package structure having a silicon substrate is provided. The method comprises providing a silicon substrate, and performing an etching process to form a plurality of cup-structures on a top surface of the silicon substrate. Next, a reflective layer is formed on the top surface of the silicon substrate, and a transparent insulating layer is formed on the reflective layer. Then, a conductive layer is formed on the transparent insulating layer, and a plurality of blue LEDs are respectively bonded on the conductive layer in each cup-structure, wherein the blue LEDs have various wavelengths. Last, a plurality of kinds of phosphor powders corresponding to the wavelengths of the blue LEDs are mixed with each other and added to a sealing material, and a sealing process is performed to form a phosphor structure on the cup-structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
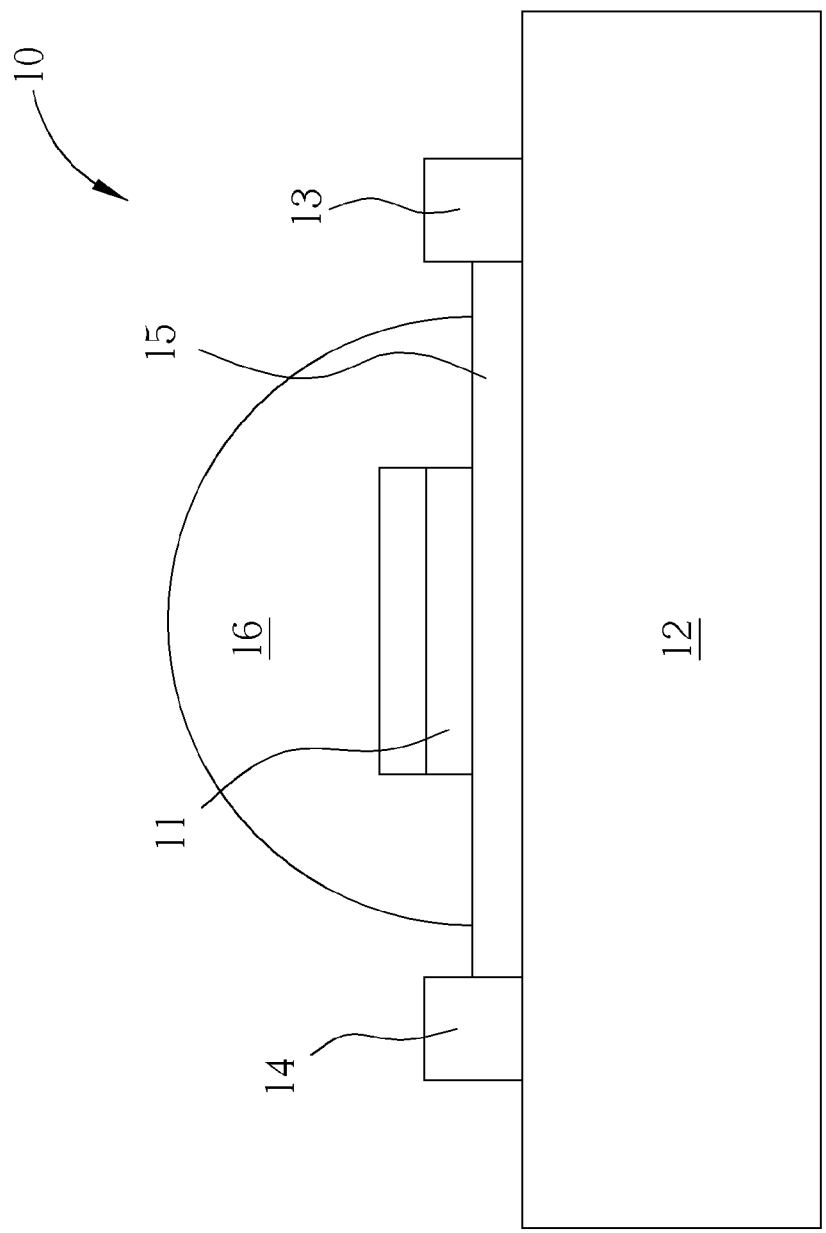
FIG. 1 is a cross-sectional schematic diagram of a white LED package structure according to the prior art.
Figure 2:
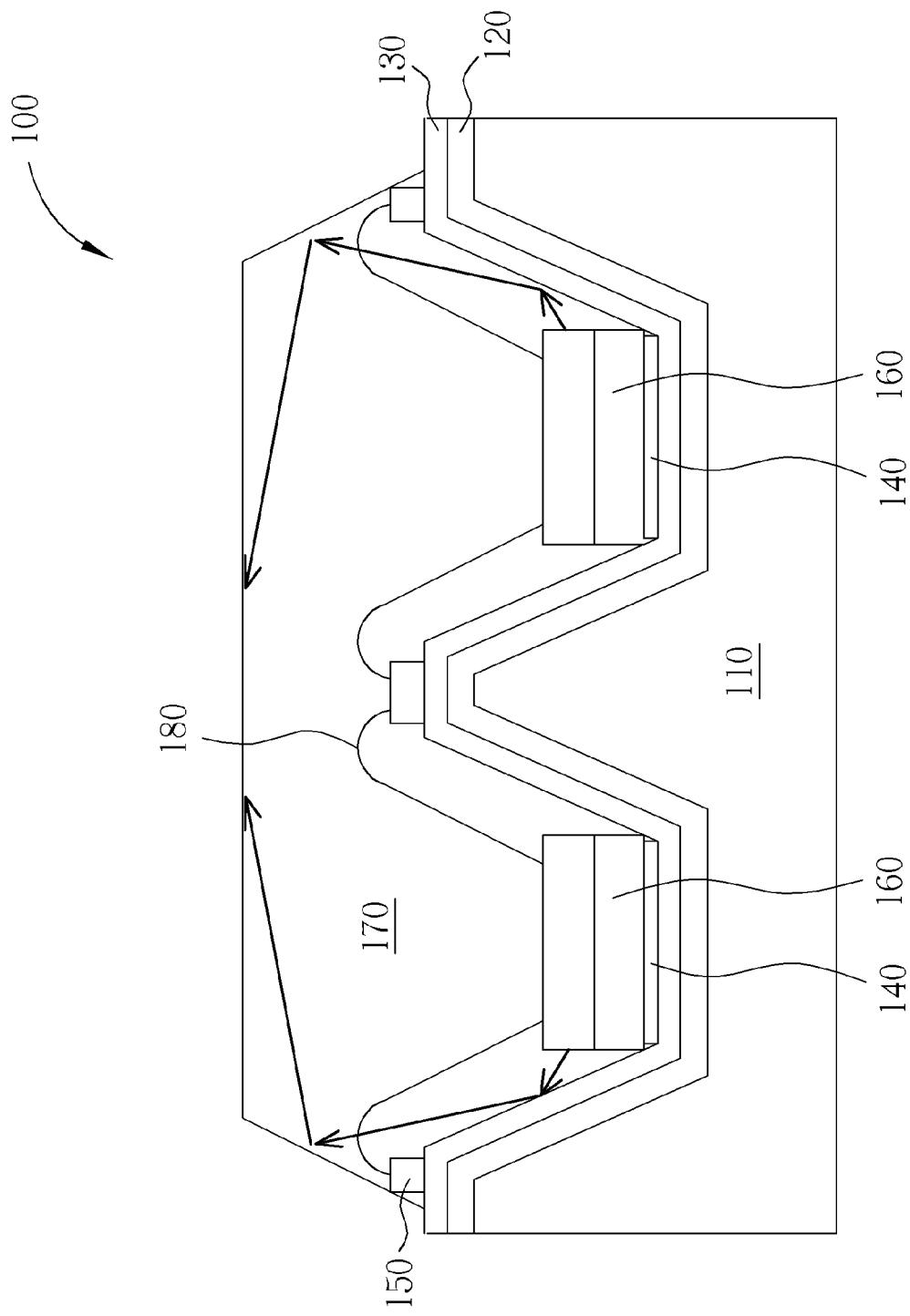
FIG. 2 is a cross-sectional schematic diagram illustrating a white LED package structure having a silicon substrate according to a preferred embodiment of the present invention.
Figure 3:
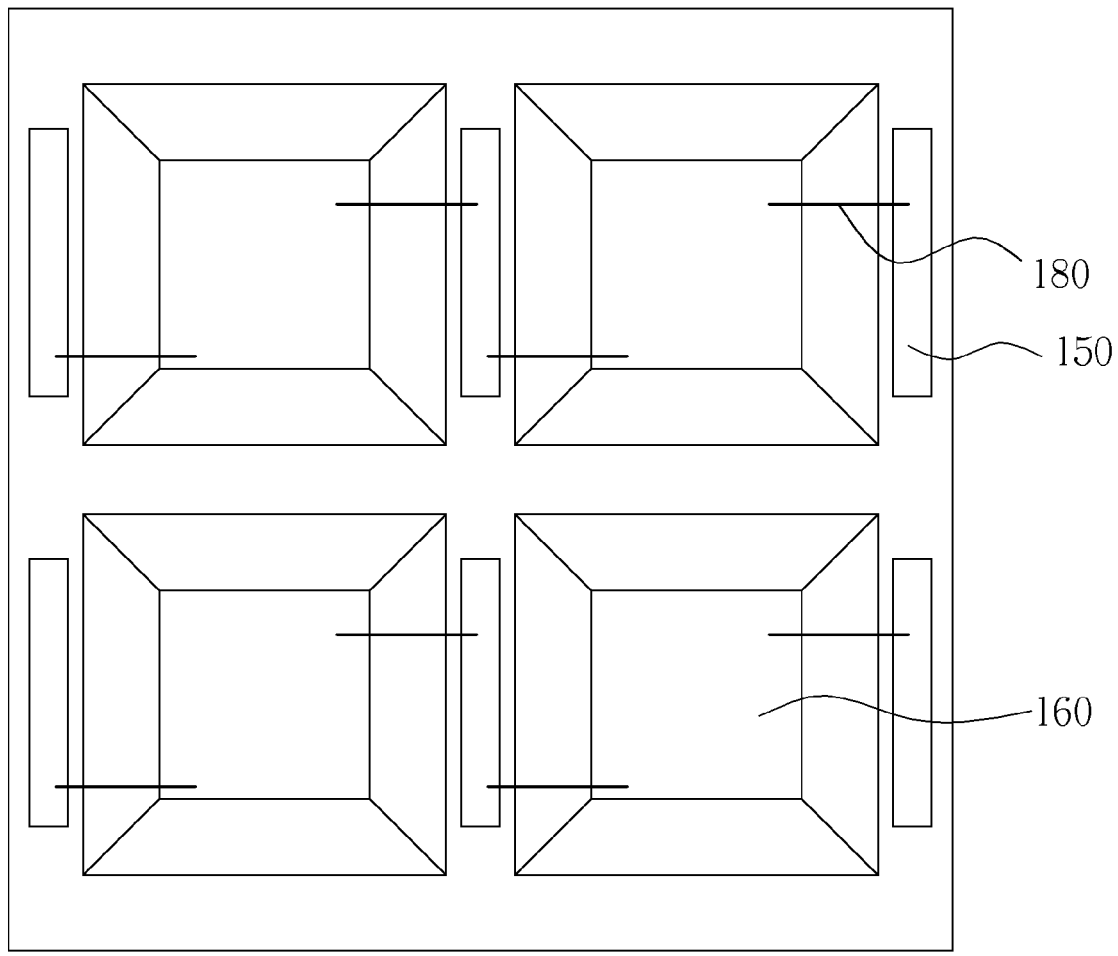
FIG. 3 is a top view illustrating the white LED package structure shown in FIG. 2.

Please refer to FIG. 2 and FIG. 3. FIG. 2 is a cross-sectional schematic diagram illustrating a white LED package structure having a silicon substrate according to a preferred embodiment of the present invention. FIG. 3 is a top view illustrating the white LED package structure shown in FIG. 2. The white LED package structure 100 includes a silicon substrate 110, a reflective layer 120, a transparent insulating layer 130, four metal bumps 140, a plurality of electrodes 150, four blue LEDs 160 and a phosphor structure 170. The material of the silicon substrate 110 can be polycrystalline silicon, amorphous silicon or monocrystalline silicon, and the silicon substrate 110 can be a rectangular silicon chip or a circular silicon chip. In addition, the silicon substrate 110 may include integrated circuits or passive components therein. A top surface of the silicon substrate 110 has four concave cup-structures whose top views are rectangular, and each cup-structure has inclined sidewalls. The inclined sidewalls of each cup-structure are used to reflect the sidelight emitted from the side surfaces of each blue LED 160 and change the direction of the sidelight to emit to the exterior so that the light utility is increased.

The reflective layer 120 is disposed on the top surface of the silicon substrate 110. The material of the reflective layer 120 is metal or an optical thin film that makes the sidewalls of the cup-structures have good reflectivity to reflect the sidelight from the side surfaces of the blue LED 160. However, in order to insulate the reflective layer 120 from devices disposed thereon, the transparent insulating layer 130 is disposed on the reflective layer 120 so that the reflective layer 120 is electrically disconnected from the metal bumps 140 and the electrodes 150. Each metal bump 140 is respectively disposed on the transparent insulating layer 130 in each cup-structure, and each metal bump 140 is used to connect each blue LED 160 and each cup-structure. Each blue LED 160 is disposed on each metal bump 140, and the positive electrodes and negative electrodes of the blue LEDs 160 are respectively electrically connected to the electrodes 150 through a plurality of wires 180.

In addition, the blue LEDs 160 respectively have various wavelengths including three specifications of 450±5 μm, 460±5 μm and 470±5 μm in order to provide a high color rendering for the white LED package structure 100. The electrodes 150 are disposed on the silicon substrate 110 between the cup-structures, and the function of the electrodes is to electrically connect the white LED package structure 100 to external circuits (not shown in figure). The phosphor structure 170 covers the cup-structures and fills up each cup-structure, and the shape of the phosphor structure 170 is a flattop pyramid-shaped. The top surface and sidewalls of a flattop pyramid respectively are flat and inclined. In addition, the phosphor structure 170 includes a plurality of kinds of phosphor powders and a sealing material. Each kind of the phosphor powder is created in accordance with the specifications of the blue LEDs 160, so each specification of the blue LEDs 160 is corresponding to one kind of phosphor powder. Each kind of phosphor powder is able to convert blue light within a certain wavelength emitted from one blue LED 160 into yellow light. The sealing material includes epoxy resins and silicon fillers, and the sealing materials can be divided into an epoxy molding compound used in molding processes and a liquid encapsulant used in encapsulating processes.

The cup-structures on the top surface of the silicon substrate 110 are arranged in a rectangular array, and the distance between the edges of the adjacent cup-structures is short, substantially smaller than 10 μm. Because the blue LEDs 160 are disposed in a short distance between the edges of the cup-structures, the effect of interference will not happen when the light emitted from the blue LEDs 160 are mixed with each other. In addition, due to the short distance arrangement of the cup-structures, the light pattern of the white LED package structure 100 can be highly uniform. It is saying that the light pattern from four different blue LEDs 160 disposed in a short distance between the adjacent cup-structures can be the same as the light pattern emitted from one blue LED whose size is the same as the total size of the four blue LEDs 160. Also, the light of the blue LEDs 160 having various wavelengths can be mutually mixed, so the white LED package structure 100 having high color rendering can be achieved. In addition, because the material of the silicon substrate 110 is silicon, the white LED package structure 100 also has a good thermal conductivity that helps the heat of the blue LEDs 160 be quickly dissipated.

In this embodiment, as indicated by the arrow in FIG. 2, the transmitting process of the light beams of the white LED package structure 100 is as follows. The blue LEDs 160 having various wavelengths will emit the blue lights within various wavelengths. The blue lights emitted from the top surface of the blue LEDs 160 will enter the phosphor structure 170, and pass through the phosphor structure 170 to emit upward. The blue lights emitted from the side surface of the blue LEDs 160 will also enter the phosphor structure 170, and then, be reflected by the inclined sidewalls of the cup-structures to emit upward. When the blue lights pass through the phosphor structure 170, one part of the blue lights will be absorbed and be converted into the yellow lights with various wavelengths by the phosphor powders in the phosphor structure 170. The other part of the blue lights will be mixed with the yellow light to form the white light. Some light reflected by the inclined sidewalls will pass through the phosphor structure 170 to emit upward. Some light reflected by the inclined sidewalls will encounter the side surfaces of the flattop pyramid of the phosphor structure 170, and then, the light will be condensed to the center of the white LED package structure 100 to be mixed with each other. Therefore, the white light with the blue lights having various wavelengths can be produced, and the white light having high color rendering is also created.

Figure 4:
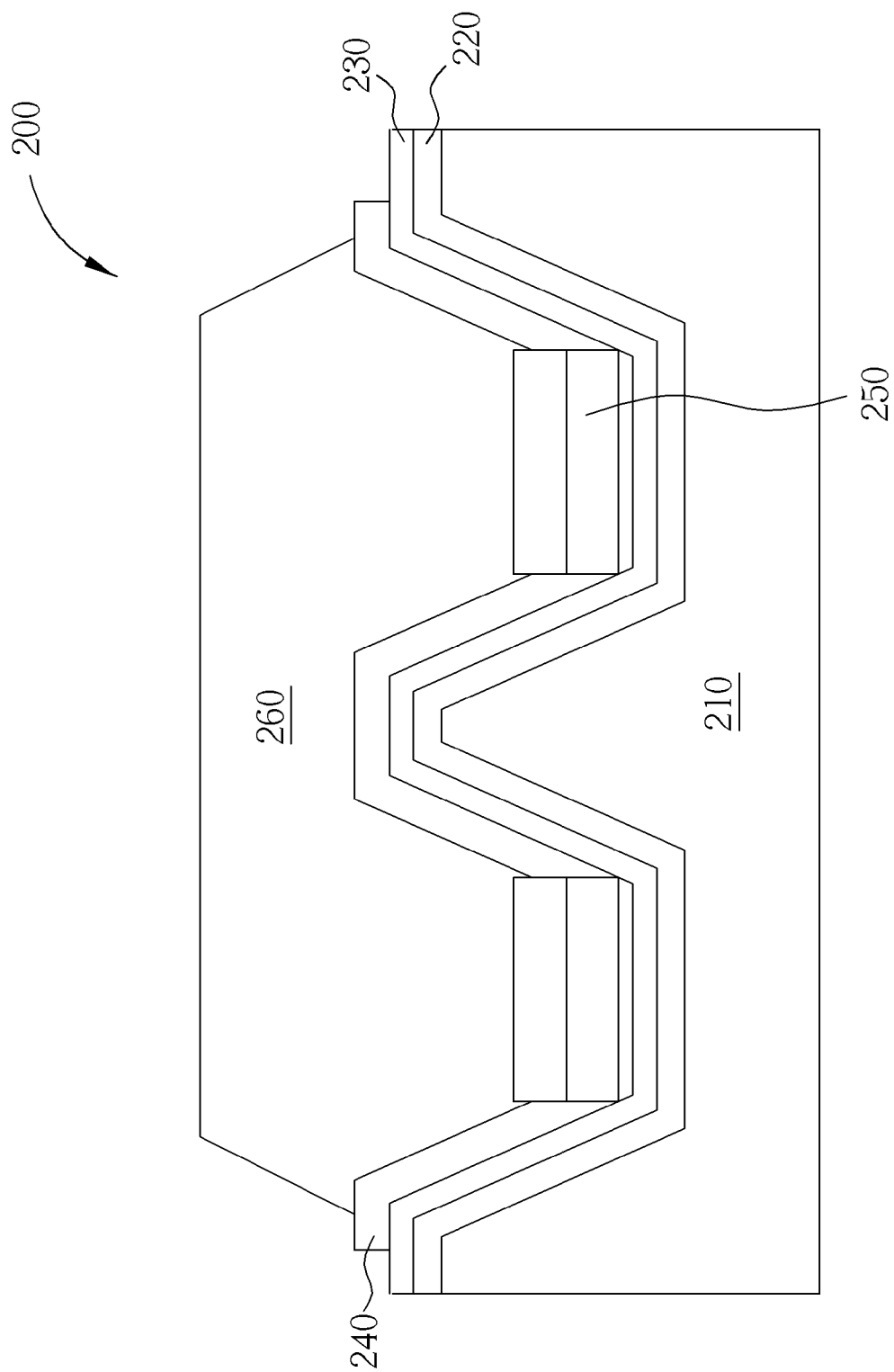
FIG. 4 is a cross-sectional schematic diagram illustrating a white LED package structure having a silicon substrate according to another embodiment of the present invention.

Please refer to FIG. 4. FIG. 4 is a cross-sectional schematic diagram illustrating a white LED package structure having a silicon substrate according to another embodiment of the present invention. For convenience, like elements will not be detailed redundantly. The white LED package structure 200 of this embodiment comprises a silicon substrate 210, a reflective layer 220, a transparent insulating layer 230, a conductive layer 240, four blue LEDs 250 and a phosphor structure 260, wherein the conductive layer 240 is disposed on the transparent insulating layer 230 and electrically connected to the external circuits (not shown in figure). Each blue LED 250 is respectively disposed on the conductive layer 240 in each cup-structure on the silicon substrate 210 by flip chip process.

In summary, the present invention provides the white LED package structure having four blue LEDs with various wavelengths that are respectively disposed in four cup-structures on the silicon substrate. The adjacent cup-structures are disposed in a short distance between each other, and the cup-structures are arranged in a rectangular array. The blue LEDs are sealed on the same silicon substrate by the phosphor structure. However, the present invention is not limited to only have four cup-structures, square-shaped cup-structure and three various kinds of wavelength specifications of the blue LEDs. The white LED package structure can have a plurality of the cup-structures on the silicon substrate. The top view shape of the cup-structure can be any other geometric shape. The blue LEDs can have a plurality of various wavelength specifications.

Figure 5:
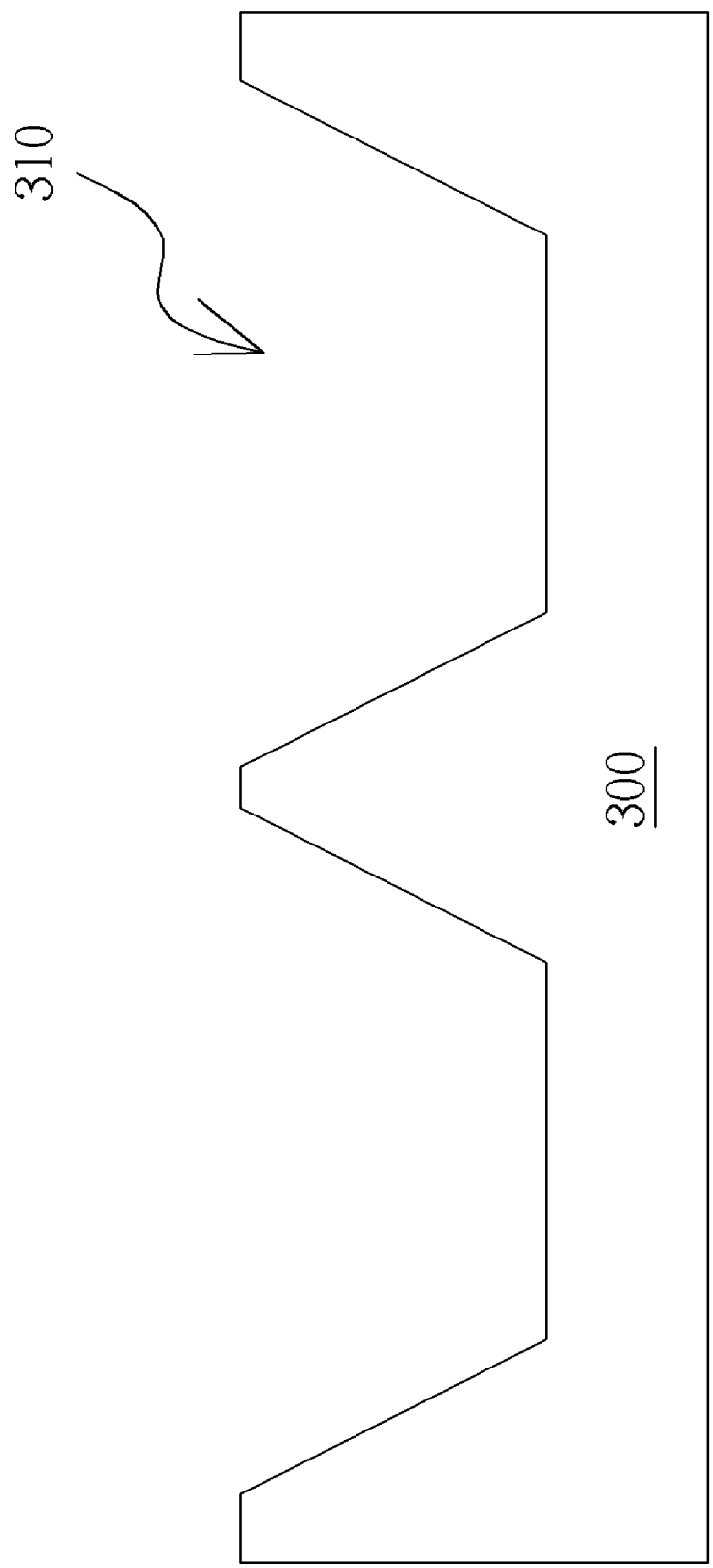
FIGS. 5-10 are schematic diagrams illustrating a method of making a white LED package structure according to a preferred embodiment of the present invention.

Please refer to FIGS. 5-10. FIGS. 5-10 are schematic diagrams illustrating a method of making a white LED package structure according to a preferred embodiment of the present invention. As shown in FIG. 5, first, a silicon substrate 300 is provided, such as a silicon wafer. Next, an etching process is performed to form a plurality of cup-structures 310 having inclined sidewalls and arranged in a rectangular array. The etching process can be a dry etching process such as a reactive ion etching (RIE) process or Bosch process or a wet etching process utilizing potassium hydroxide (KOH), tetramethyl ammonium hydroxide (TMAH) or ethylenediamine-pyrocatechol-water (EDP) as an etching solution. The Bosch process, also known as pulsed or time-multiplexed etching, alternates repeatedly between standard isotropic plasma etch and deposition of a chemically inert passivation layer to achieve nearly vertical structures.

Figure 6:
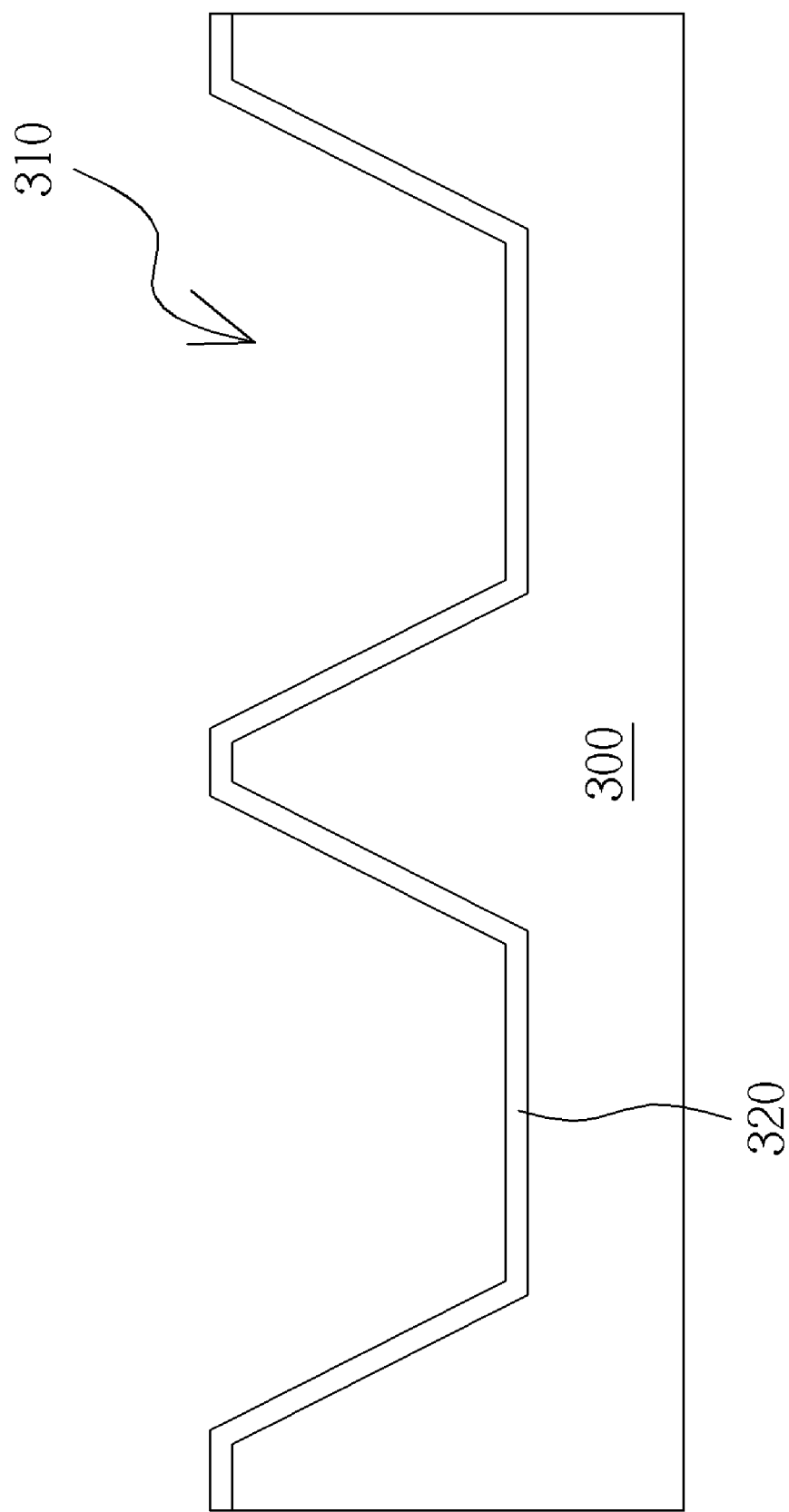
Figure 7:
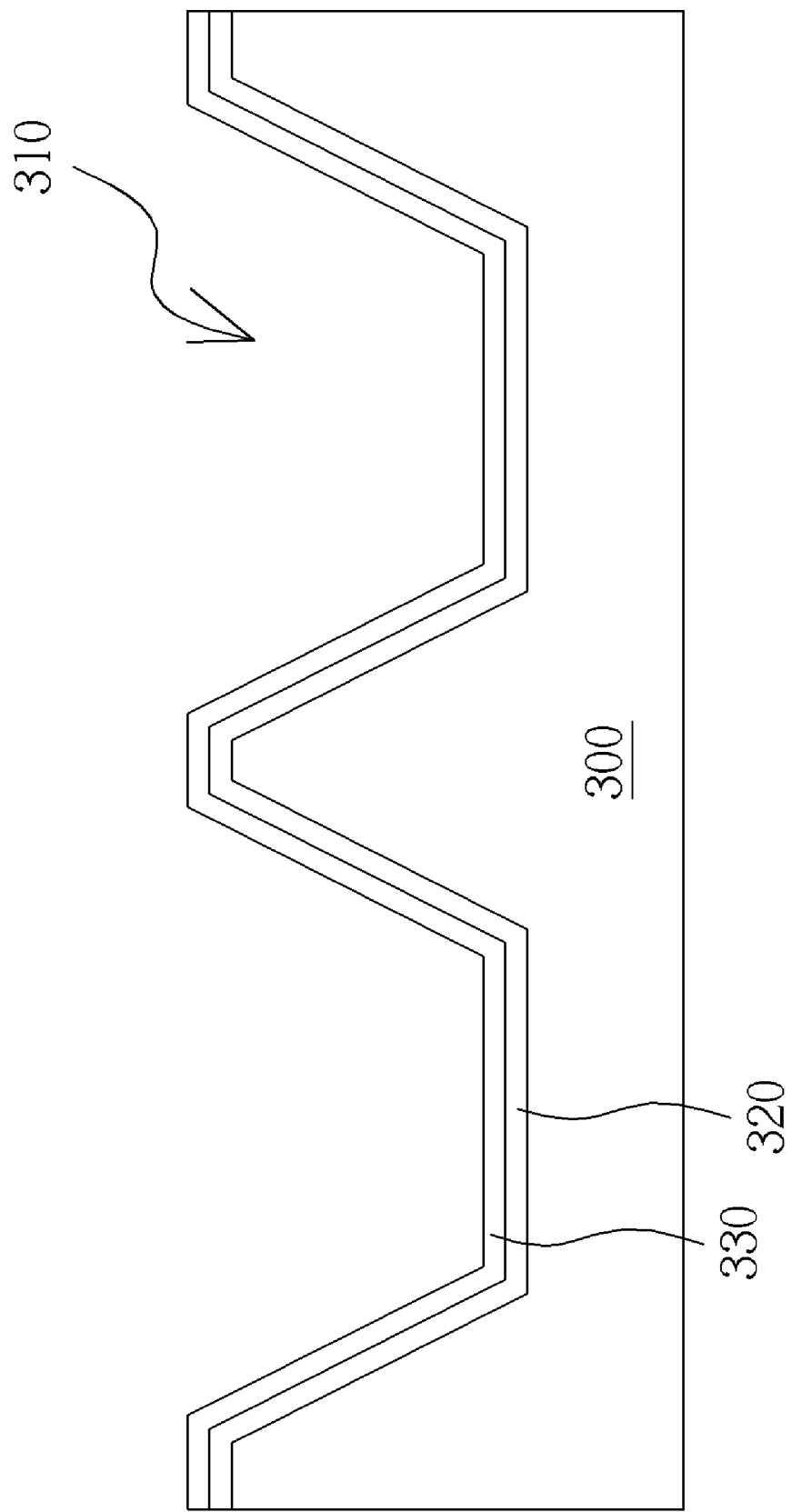
Figure 8:
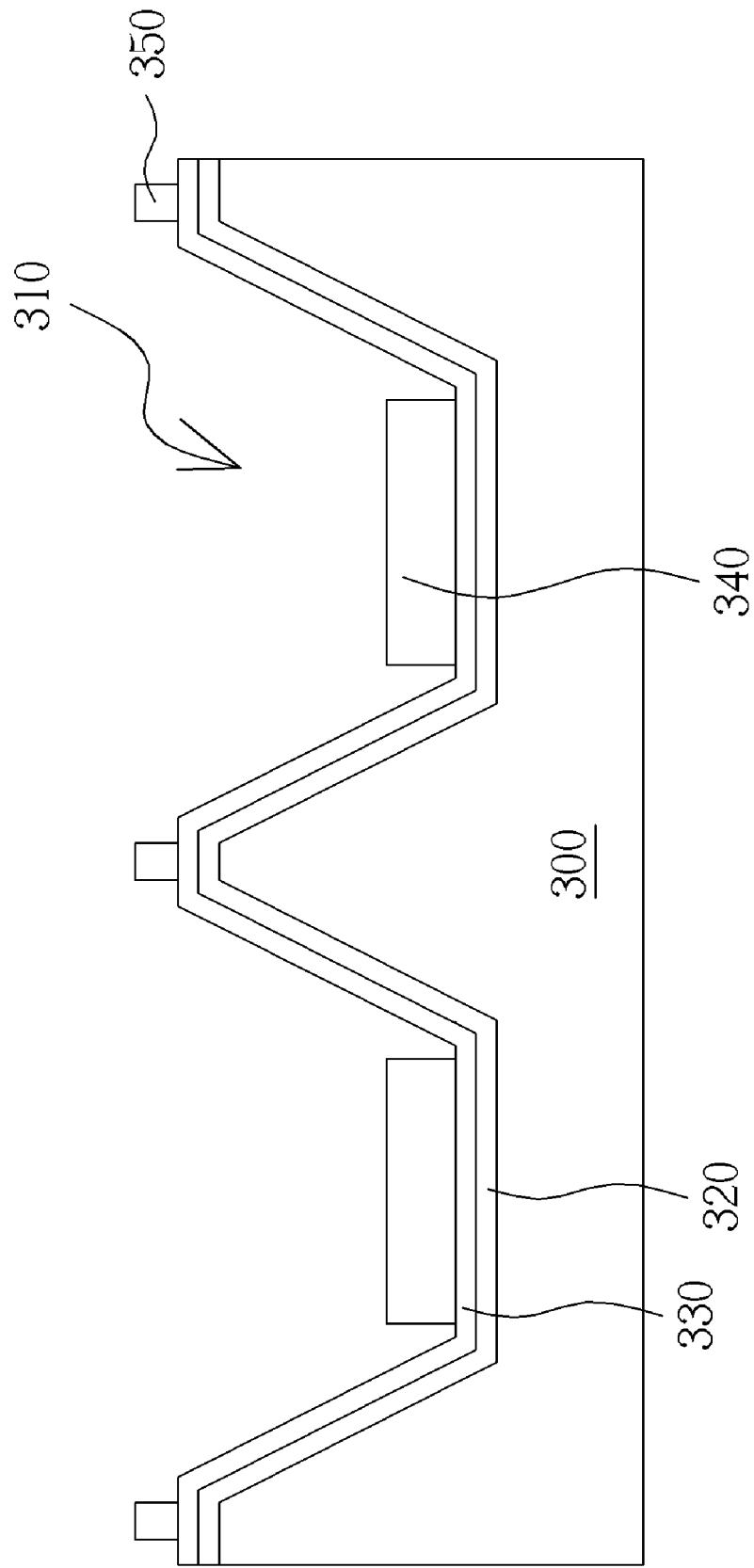
Figure 9:
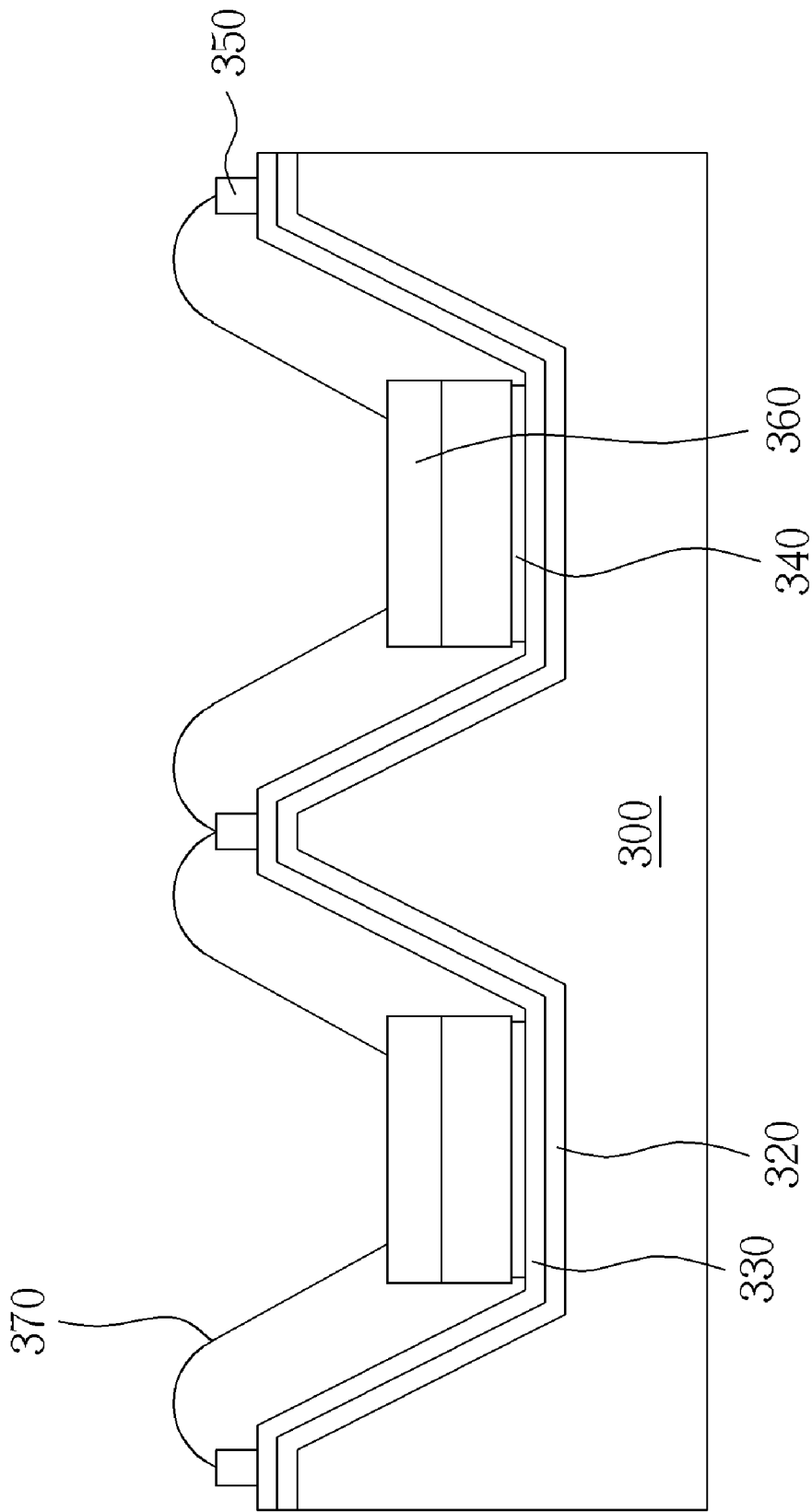
Figure 10:
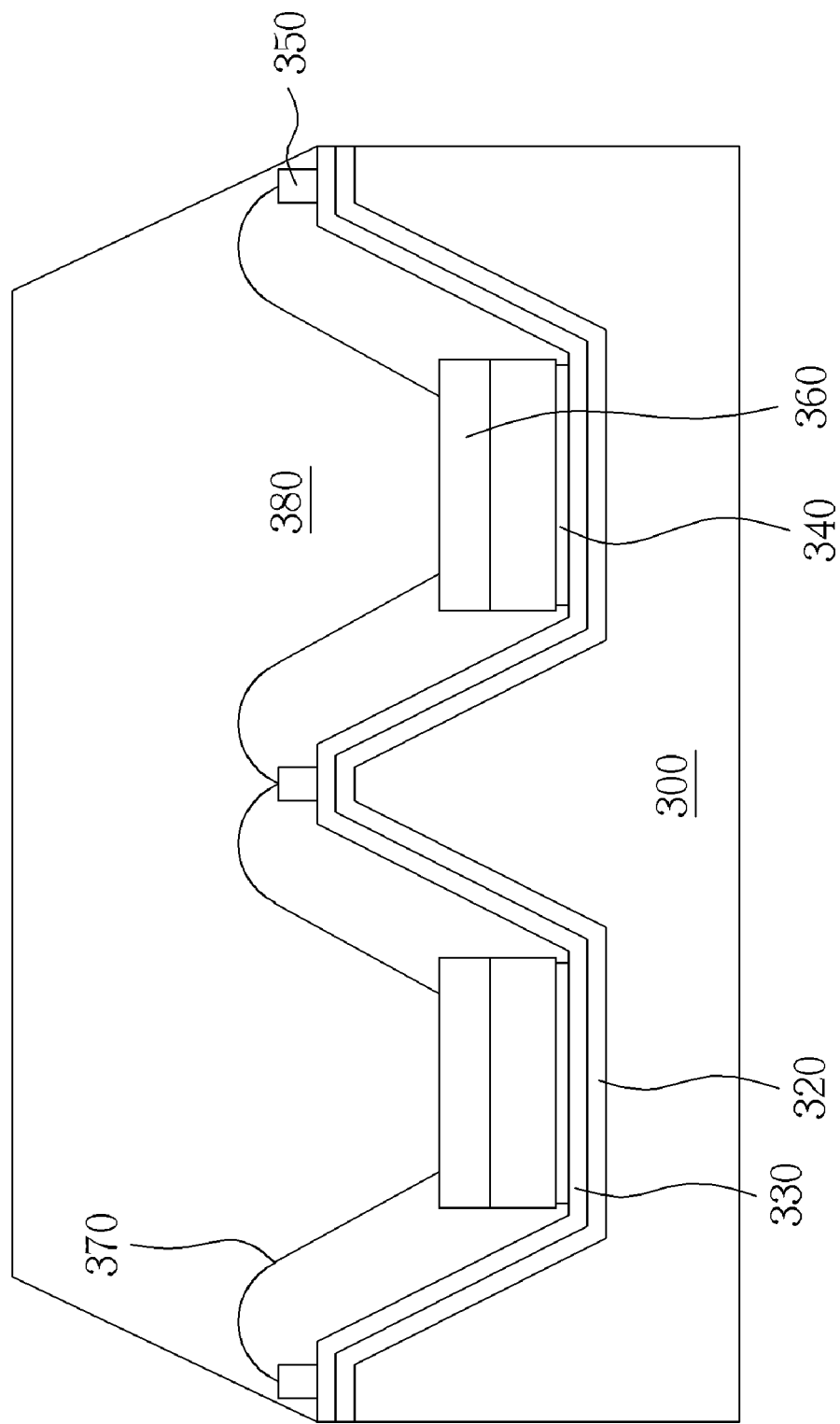

The required optical effect of the white light package structure 300 can be achieved by controlling depth, width, shape and inclined angle of the sidewalls of the cup-structure 310 and etc. As shown in FIG. 6, a reflective layer 320 is formed on the top surface of the silicon substrate 300 having the cup-structures 310 by performing a process of sputtering, evaporation or chemical deposition. As shown in FIG. 7, a transparent insulating layer 330 is formed on the reflective layer 320 by performing a process of sputtering, evaporation or chemical deposition. As shown in FIG. 8, then, a plurality of metal bumps 340 are formed on the transparent insulating layer 330 in each cup-structure 310 by performing a process of deposition or electroplate combined with the lithographic and etching process or lift off process. At the same time, a plurality of electrodes 350 is formed on the transparent insulating layer 330 between the adjacent cup-structures 310. As shown in FIG. 9, a plurality of blue LEDs 360 are respectively bonded on the metal bumps 340 in each cup-structure 310 by performing a die attachment using glass frit. Then, each blue LED 360 is respectively connected electrically to the electrodes 350 through wires 370 by ultrasonic wire bonding method. Last, as shown in FIG. 10, the phosphor powders corresponding to the wavelengths of the blue LEDs 360 are mixed with each other and are added to a sealing material. Then, a phosphor structure 380 is formed on the cup-structures 310 by performing a sealing process, wherein the sealing process is a molding process or encapsulating process. A white LED package structure is thus completed.

Figure 11:
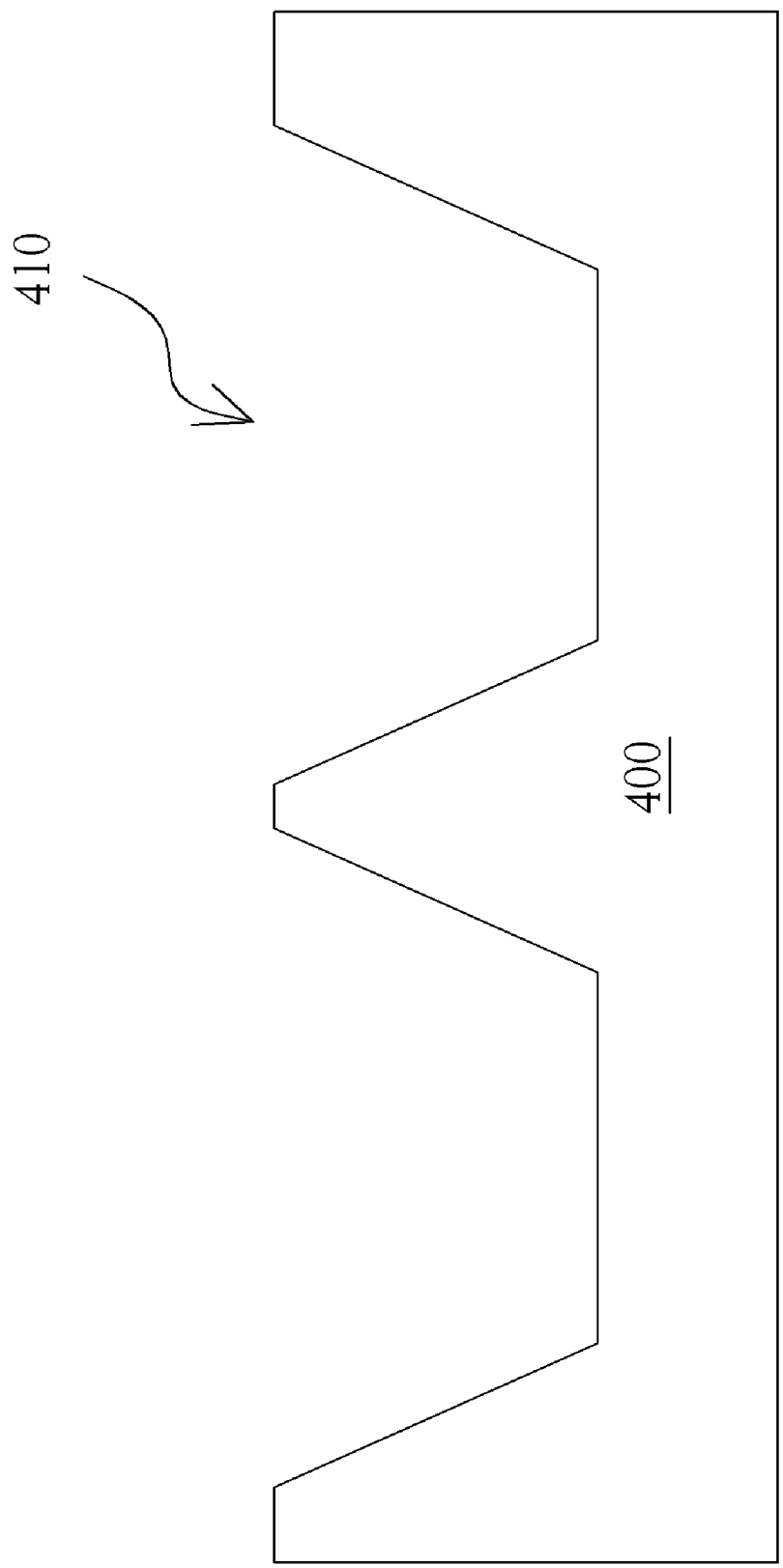
FIGS. 11-16 are schematic diagrams illustrating a method of making a white LED package structure according to another preferred embodiment of the present invention.
Figure 12:
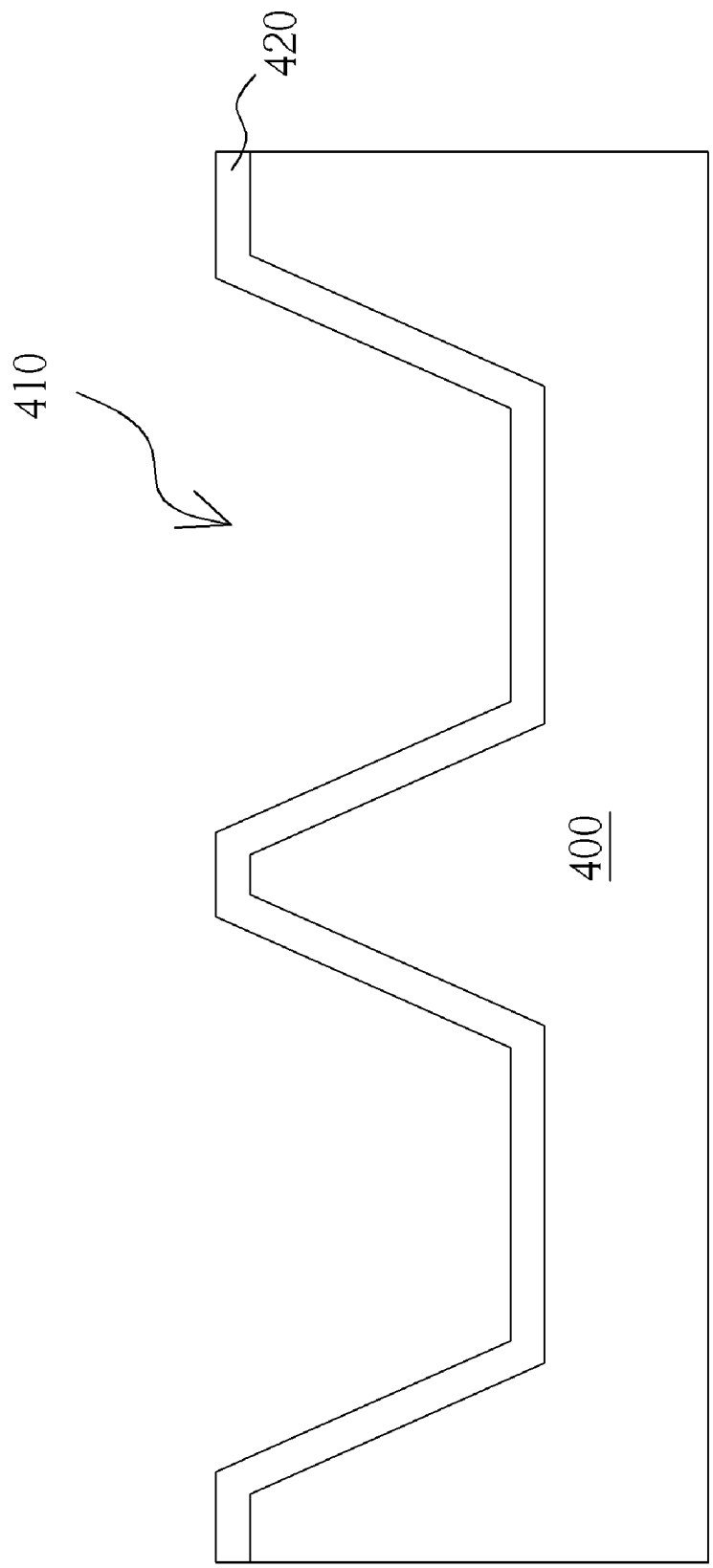
Figure 13:
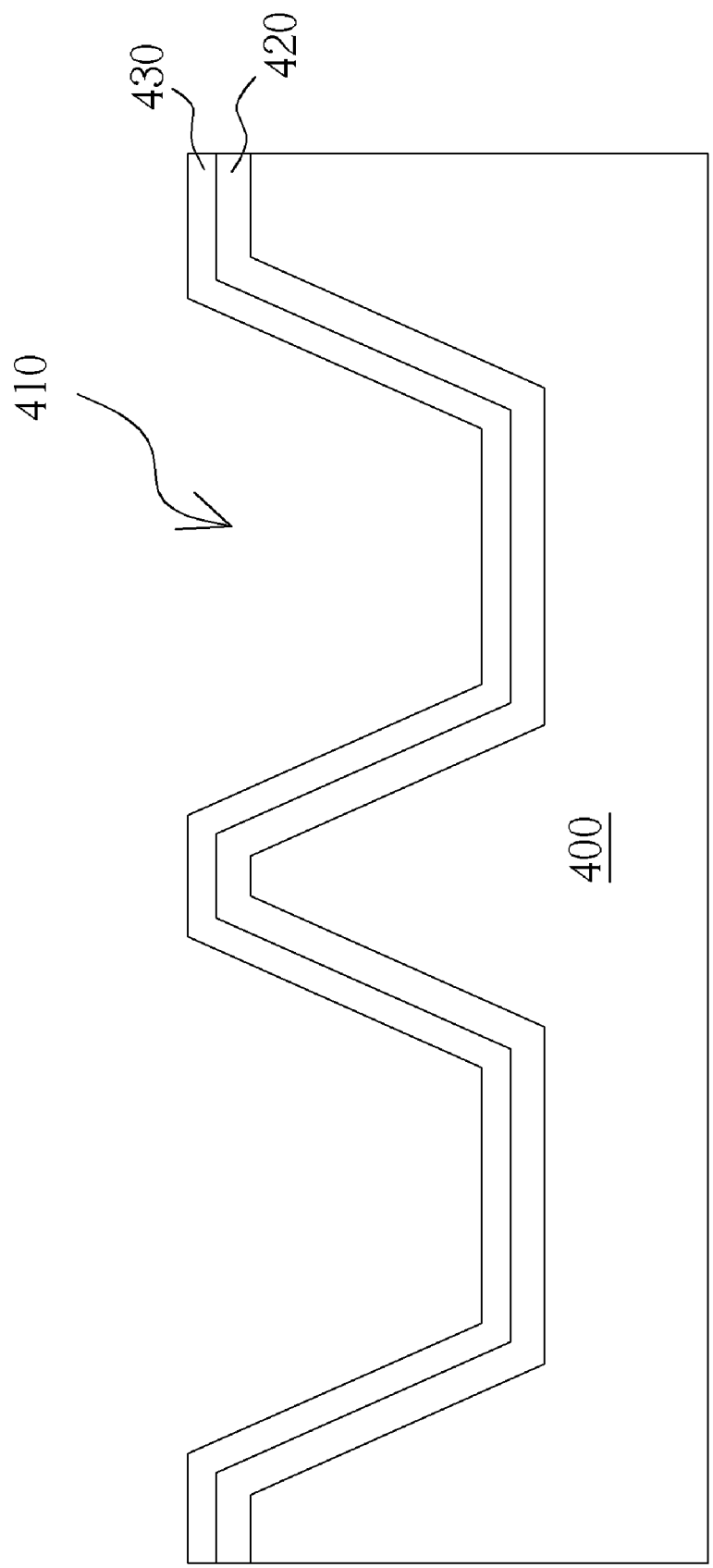
Figure 14:
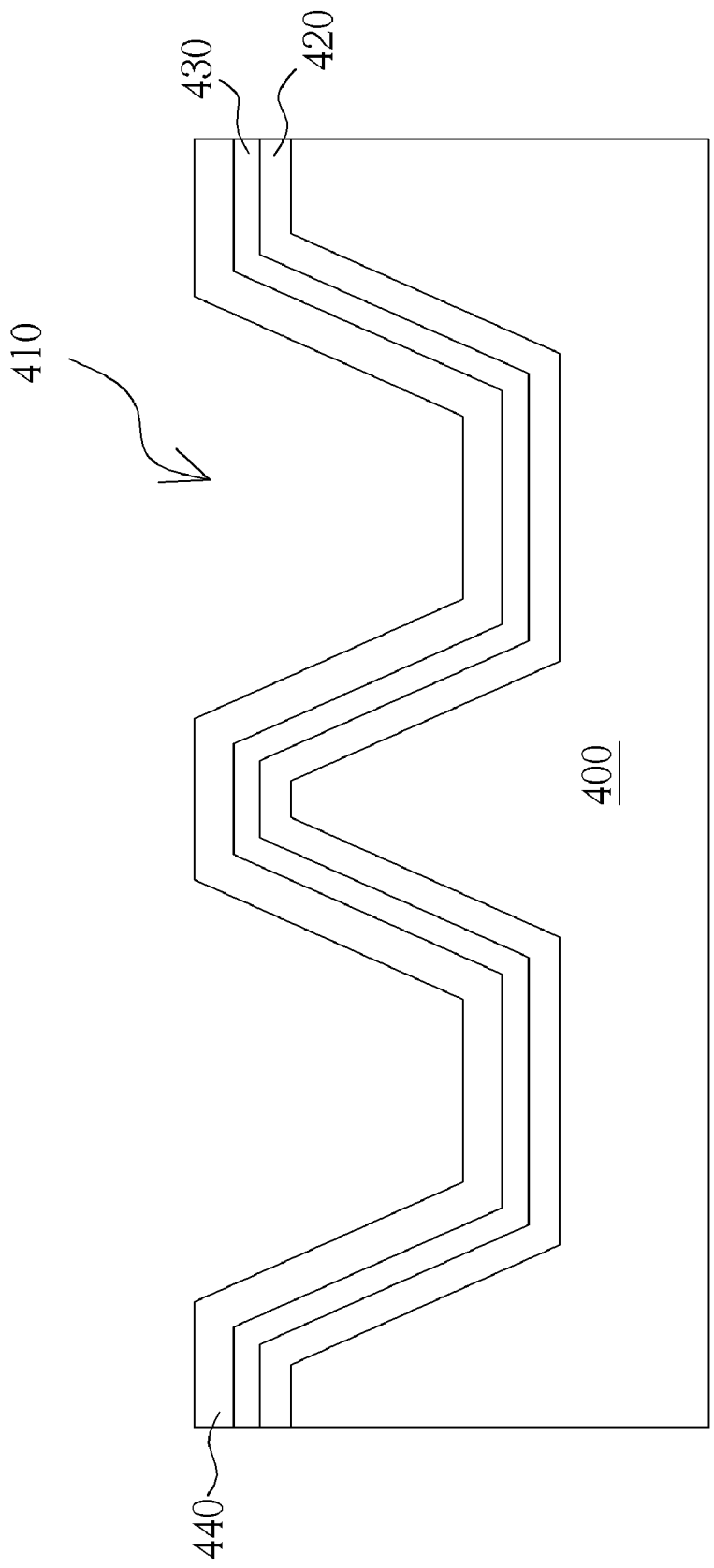
Figure 15:
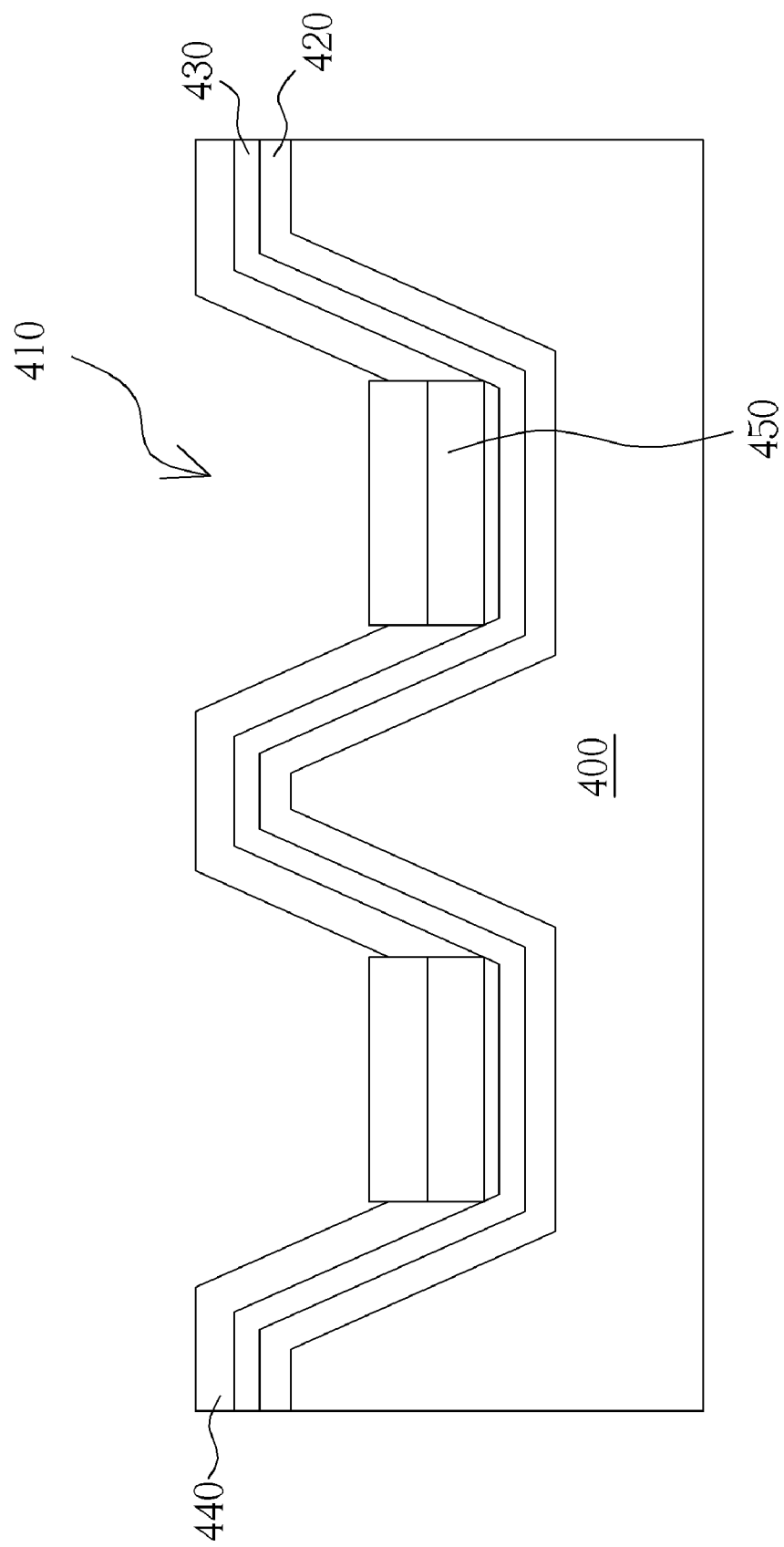
Figure 16:
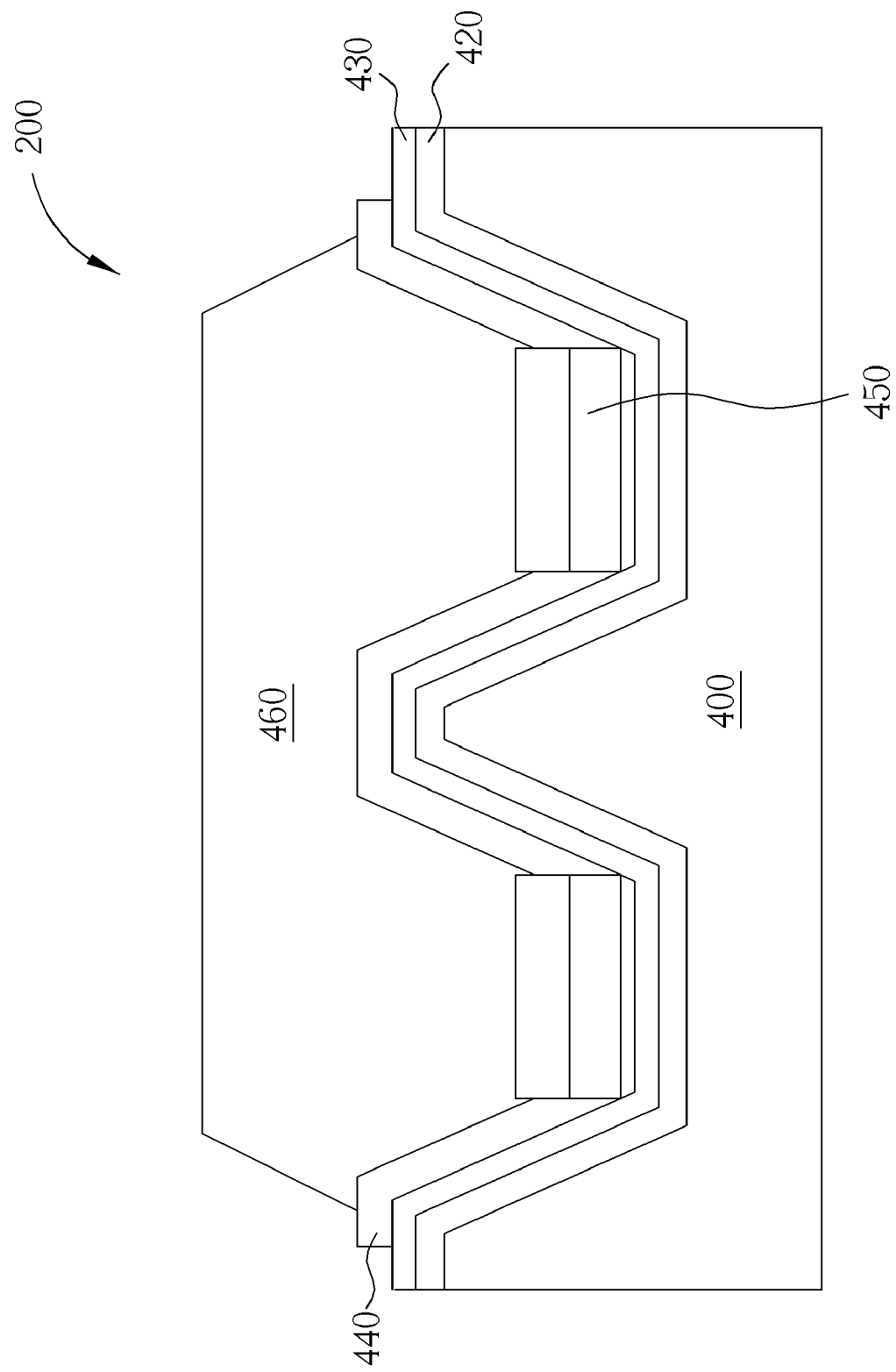

Please refer to FIGS. 11-16. FIGS. 11-16 are schematic diagrams illustrating a method of making a white LED package structure according to another preferred embodiment of the present invention. For convenience, like process the same as the mentioned above will not be detailed redundantly. As shown in FIG. 11, first, a silicon substrate 400 is provided, such as a silicon wafer, and then, an etching process is performed to form a plurality of cup-structures 410 having inclined sidewalls and arranged in a rectangular array. As shown in FIG. 12, a reflective layer 420 is formed on the top surface of the silicon substrate 400 having the cup-structures 410 by performing a process of sputtering, evaporation or chemical deposition. As shown in FIG. 13, a transparent insulating layer 430 is formed on the reflective layer 420 by performing a process of sputtering, evaporation or chemical deposition. As shown in FIG. 14, then, a conductive layer 440 is formed on the transparent insulating layer 430 by performing a process of deposition or electroplate combined with the lithographic and etching process or lift off process. As shown in FIG. 15, the blue LEDs 450 are respectively bonded on the conductive layer 440 in the cup-structures 410 by performing a flip chip attachment. Last, as shown in FIG. 16, the phosphor powders corresponding to the wavelengths of the blue LEDs 450 are mixed with each other and added to a sealing material, and then, a phosphor structure 380 is formed on the cup-structures 410 by performing a sealing process, completing the white LED package structure.

In summary, the present invention provides a method of making the white LED package structure. The present invention utilizes a specific etching process to form the required cup-structures on the silicon substrate. Then, the present invention utilizes a microelectromechanical process of electroplate or deposition or the semiconductor process to form some layers that can provide electrical connection and light reflection. The present invention combines above-mentioned process with an LED manufacturing process that includes the die attachment, the wire bonding and the sealing process. The white LED package structure having the blue LED with various wavelengths that are mixed with each other can be performed so as to have the characteristic of high color rendering and colorful tone.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of making a white LED package structure having a silicon substrate comprising:
   providing a silicon substrate, and performing an etching process to form a plurality of cup-structures on a top surface of the silicon substrate;
   forming a reflective layer on the top surface of the silicon substrate;
   forming a transparent insulating layer on the reflective layer;
   forming a plurality of metal bumps on the transparent insulating layer respectively in each cup-structure, and forming a plurality of electrodes on the transparent insulating layer between the cup-structures;
   respectively bonding a plurality of blue LEDs on each metal bump in each cup-structure, and electrically connecting respectively the blue LEDs to the electrodes, wherein the blue LEDs emit lights with different peak wavelengths; and
   mixing a plurality of kinds of phosphor powders, the plurality of kinds of phosphor powders having different absorption spectra respectively corresponding to the different peak wavelengths of the lights emitted by the plurality of blue LEDs, and adding a sealing material, and then, performing a sealing process using the mixed phosphor powders and sealing material to form a phosphor structure on the plurality of cup-structures.

2. The method of claim 1, wherein each cup-structure has inclined sidewalls.

3. The method of claim 2, wherein the etching process making the inclined sidewalls of the cup-structures comprises a reactive ion etching process.

4. The method of claim 2, wherein the etching process making the inclined sidewalls of the cup-structures comprises a Bosch process.

5. The method of claim 2, wherein the etching process making the inclined sidewalls of the cup-structures comprises a wet etching process utilizing KOH solution as an etching solution.

6. The method of claim 2, wherein the etching process making the inclined sidewalls of the cup-structures comprises a wet etching process utilizing TMAH solution as an etching solution.

7. The method of claim 2, wherein the etching process making the inclined sidewalls of the cup-structures comprises a wet etching process utilizing EDP solution as an etching solution.

8. The method of claim 1, wherein the reflective layer is formed on the silicon substrate by sputtering, evaporation or chemical deposition.

9. The method of claim 1, wherein the transparent insulating layer is formed on the silicon substrate by sputtering, evaporation or chemical deposition.

10. The method of claim 1, wherein the metal bumps are formed on the transparent insulating layer by lift-off.

11. The method of claim 1, wherein the metal bumps are formed on the transparent insulating layer by electroplating.

12. The method of claim 1, wherein the blue LEDs are bonded on the metal bumps by die attachment using glass frit.

13. The method of claim 1, wherein the sealing process is a molding process.

14. The method of claim 1, wherein the sealing process is an encapsulating process.

15. A method of making a white LED package structure having a silicon substrate comprising:
    providing a silicon substrate, and performing an etching process to form a plurality of cup-structures on a top surface of the silicon substrate;
    forming a reflective layer on the top surface of the silicon substrate;
    forming a transparent insulating layer on the reflective layer;
    forming a conductive layer on the transparent insulating layer;
    respectively bonding a plurality of blue LEDs on the conductive layer in each cup-structure, wherein the blue LEDs emit lights with different peak wavelengths; and
    mixing a plurality of kinds of phosphor powders, the plurality of kinds of phosphor powders having different absorption spectra respectively corresponding to the different peak wavelengths of the lights emitted by the plurality of blue LEDs, and adding a sealing material, and then performing a sealing process using the mixed phosphor powders and sealing material to form a phosphor structure on the plurality of cup-structures.

16. The method of claim 15, wherein each cup-structure has inclined sidewalls.

17. The method of claim 16, wherein the etching process fabricating the inclined sidewalls of the cup-structures comprises a reactive ion etching process.

18. The method of claim 16, wherein the etching process fabricating the inclined sidewalls of the cup-structures comprises a Bosch process.

19. The method of claim 16, wherein the etching process fabricating the inclined sidewalls of the cup-structures comprises a wet etching process utilizing KOH solution as an etching solution.

20. The method of claim 16, wherein the etching process fabricating the inclined sidewalls of the cup-structures comprises a wet etching process utilizing TMAH solution as an etching solution.

21. The method of claim 16, wherein the etching process fabricating the inclined sidewalls of the cup-structures comprises a wet etching process utilizing EDP solution as an etching solution.

22. The method of claim 15, wherein the reflective layer is formed on the silicon substrate by sputtering, evaporation or chemical deposition.

23. The method of claim 15, wherein the transparent insulating layer is formed on the silicon substrate by sputtering, evaporation or chemical deposition.

24. The method of claim 15, wherein the conductive layer are formed on the transparent insulating layer by lift-off.

25. The method of claim 15, wherein the conductive layer are formed on the transparent insulating layer by electroplating.

26. The method of claim 15, wherein the blue LEDs are bonded on the conductive layer by flip chip attachment.

27. The method of claim 15, wherein the sealing process is a molding process.

28. The method of claim 15, wherein the sealing process is an encapsulating process.

* * * * *